(12) United States Patent
Wang et al.

(10) Patent No.: US 11,917,750 B2
(45) Date of Patent: Feb. 27, 2024

(54) SHIELDING STRUCTURE FOR SYSTEM-IN-PACKAGE AND ELECTRONIC DEVICE

(71) Applicant: Huawei Technologies Co., Ltd., Shenzhen (CN)

(72) Inventors: Huijuan Wang, Shenzhen (CN); Jinsen Cai, Dongguan (CN); Bin Hu, Shenzhen (CN); Bo Kong, Hangzhou (CN); Tian Zhao, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 183 days.

(21) Appl. No.: 17/433,213

(22) PCT Filed: Feb. 17, 2020

(86) PCT No.: PCT/CN2020/075547
§ 371 (c)(1),
(2) Date: Aug. 23, 2021

(87) PCT Pub. No.: WO2020/169000
PCT Pub. Date: Aug. 27, 2020

(65) Prior Publication Data
US 2022/0141950 A1    May 5, 2022

(30) Foreign Application Priority Data
Feb. 23, 2019 (CN) .......................... 201910139289.8

(51) Int. Cl.
*H01L 23/552* (2006.01)
*H05K 1/02* (2006.01)

(52) U.S. Cl.
CPC ......... *H05K 1/0224* (2013.01); *H01L 23/552* (2013.01); *H05K 2201/0723* (2013.01)

(58) Field of Classification Search
CPC .................................................... H01L 23/552
See application file for complete search history.

(56) References Cited

U.S. PATENT DOCUMENTS

| 5,644,107 A | 7/1997 | Kubota et al. |
| 2009/0159316 A1 | 6/2009 | Kuramochi |

(Continued)

FOREIGN PATENT DOCUMENTS

| CN | 101930969 A | 12/2010 |
| CN | 103094256 A | 5/2013 |

(Continued)

*Primary Examiner* — Hung V Ngo
(74) *Attorney, Agent, or Firm* — Conley Rose, P.C.

(57) ABSTRACT

A shielding structure for a system-in-package includes a substrate having stacked first ground planes in the substrate, a second ground plane on a surface of the substrate, and a ground pad arranged along an edge of the substrate disposed on the second ground plane. In addition, ground holes disposed in the substrate electrically couple the adjacent ground planes. The ground holes are arranged in a ring around a board body and spacing between the adjacent ground holes is less than a specified distance in an arrangement that defines a Faraday cage. A device is disposed on the opposing surface of the substrate and a package layer is disposed on the device.

20 Claims, 5 Drawing Sheets

(56) References Cited

U.S. PATENT DOCUMENTS

| | | | |
|---|---|---|---|
| 2009/0256244 A1* | 10/2009 | Liao | H01L 21/568 |
| | | | 257/E23.114 |
| 2011/0121449 A1* | 5/2011 | Lin | H01L 21/568 |
| | | | 257/737 |
| 2012/0074538 A1* | 3/2012 | Tsai | H01L 23/3121 |
| | | | 257/659 |
| 2015/0035127 A1 | 2/2015 | Yang et al. | |
| 2015/0170980 A1 | 6/2015 | Kosaka et al. | |
| 2017/0098637 A1 | 4/2017 | Hamada | |
| 2017/0287852 A1 | 10/2017 | Jeon et al. | |
| 2017/0345771 A1* | 11/2017 | Hu | H01L 23/5384 |
| 2018/0040569 A1* | 2/2018 | Lee | H01L 23/49811 |
| 2018/0294235 A1 | 10/2018 | Han et al. | |
| 2022/0289559 A1* | 9/2022 | Duan | H01L 24/17 |

FOREIGN PATENT DOCUMENTS

| | | |
|---|---|---|
| CN | 103400825 A | 11/2013 |
| CN | 104576616 A | 4/2015 |
| CN | 104716114 A | 6/2015 |
| CN | 105263303 A | 1/2016 |
| CN | 109803523 A | 5/2019 |
| EP | 3905246 A1 | 11/2021 |
| EP | 3905871 A1 | 11/2021 |

\* cited by examiner

SHIELDING STRUCTURE FOR SYSTEM-IN-PACKAGE AND ELECTRONIC DEVICE

CROSS-REFERENCE TO RELATED APPLICATIONS

This application is a U.S. National Stage of International Patent Application No. PCT/CN2020/075547, filed on Feb. 17, 2020, which claims priority to Chinese Patent Application No. 201910139289.8, filed on Feb. 23, 2019, both of which are hereby incorporated by reference in their entireties.

TECHNICAL FIELD

This application relates to the field of mobile terminal technologies, and in particular, to a shielding structure for a system-in-package and an electronic device.

BACKGROUND

With development of SiP (System-in-Package, system-in-package) technologies and a requirement for a miniaturized mobile phone, an active module and a passive device are integrated into a system at a package level by using a package technology to improve device integration, so as to reduce a device area on a PCB and improve integration and simplicity of the PCB. Currently, it is also an important way to miniaturize a mobile phone by using a large quantity of SiPs as customized modules. A grounding mode and a structure for SIP shielding are very important, and it is necessary to ensure that a good Faraday cage is formed between a shield layer and a bottom of a substrate to form a good electromagnetic shield. However, a grounding effect of the system in-package in the prior art is not ideal, resulting in a relatively poor electromagnetic shielding effect.

SUMMARY

This application provides a shielding structure for a system-in-package and an electronic device, to improve an electromagnetic shielding effect of the shielding structure for a system-in-package.

According to a first aspect, a shielding structure for a system-in-package is provided. The shielding structure for a system-in-package includes a substrate and a device disposed on the substrate. In disposing of the device, the device is packaged by a package layer and is wrapped by a shield layer, to improve a shielding effect of the shielding structure for a system-in-package. A grounding effect is improved in the substrate provided in this application. Two opposite surfaces, namely, a first surface and a second surface, of the substrate are defined for ease of description. The device is disposed on the first surface of the substrate. A second ground plane that surrounds an edge of the substrate is disposed on the second surface of the substrate. At least one ring of ground pads arranged along the edge of the substrate is disposed on the second ground plane. In addition, at least two stacked first ground planes are disposed in the substrate, and the first ground plane is disposed around the edge of the substrate. When the shield layer wraps the package layer, the shield layer extends to the substrate, and a part that extends to the substrate is electrically connected to the first ground plane for grounding. To reduce a ground resistance, a plurality of ground holes are further disposed in the substrate, and the ground holes are arranged along the edge of the substrate and are disposed at a plurality of layers. A spacing between adjacent ground holes at a same layer is less than a specified distance, so that the ground holes can form a good Faraday cage, to improve an electromagnetic shielding effect of the shield layer. In addition, an electrical connection between adjacent first ground planes and an electrical connection between the second ground plane and the first ground plane adjacent to the second ground plane are implemented by using the ground hole, so that the ground hole electrically connects two adjacent ground planes in the first ground planes and the second ground plane, to reduce the ground resistance. Furthermore, electromagnetic interference at a bottom of the substrate is avoided by using the disposed second ground plane and the at least one ring of disposed ground pads, to improve a shielding effect.

The specified distance is 300 μm.

In specific disposing of the shield layer, the part, of the shield layer, that extends to the substrate may be electrically connected to the first ground plane and the second ground plane to increase a connection area between the shield layer and the ground plane and reduce the ground resistance, so as to improve a shielding effect at the bottom of the substrate.

In specific disposing of the ground hole, staggered ground holes are disposed at different layers, to improve a grounding effect.

In specific disposing of the ground hole, the plurality of ground holes include a partial ground hole whose inner wall is exposed on a side surface of the substrate. When the shield layer extends to the side surface of the substrate, the shield layer is electrically connected to the partial ground hole to increase the connection area between the shield layer and the ground plane, so as to improve a shielding effect. The partial ground hole whose inner wall is exposed on the side surface of the substrate is a structure formed after a complete ground hole is cut.

In specific disposing of the ground hole, the ground holes include a first ground hole and a second ground hole. A diameter of the first ground hole is greater than a diameter of the second ground hole. At least one of the first ground hole and the second ground hole may be used as the partial ground hole formed after cutting to increase the connection area between the shield layer and the ground plane, so as to improve a shielding effect.

In specific disposing of the first ground hole and the second ground hole, the first ground hole and the second ground hole are arranged in a staggered manner to increase the connection area between the shield layer and the ground plane, so as to improve a shielding effect.

In addition, a vertical distance between a center of the first ground hole and the side surface of the substrate is different from a vertical distance between a center of the second ground hole and the side surface of the substrate to increase the connection area between the shield layer and the ground plane, so as to improve a shielding effect.

In specific disposing of the ground hole, the ground holes include a plurality of rows of ground holes that are arranged in an inclined manner with respect to the edge of the substrate. In addition, ground holes in each row include a partial ground hole that is formed after cutting and that is exposed on the side surface of the substrate to increase the connection area between the shield layer and the ground plane, so as to improve a shielding effect.

In a specific implementable solution, a first stress relief region is disposed on at least one side surface of the substrate, to reduce stress concentration of the substrate after cutting.

In a specific implementable solution, the ground holes are disposed on both sides of the first stress relief region.

In a specific implementable solution, a second stress relief region is disposed on at least one corner of the substrate. The second stress relief region is disposed on the corner of the substrate to reduce stress after cutting.

In a specific implementation solution, ground pads included in the at least one ring of ground pads are electrically connected by using a copper wire to reduce the ground resistance of the shield layer, so as to improve a shielding effect.

In a specific implementation solution, a diameter of the ground hole is greater than or equal to 50 μm and less than or equal to 300 μm, to ensure a good conductive effect.

When the ground holes include the first ground hole and the second ground hole with different diameters, the diameter of the first ground hole is greater than or equal to 100 μm and less than or equal to 300 μm, and the diameter of the second ground hole is greater than or equal to 50 μm and less than or equal to 150 μm.

According to a second aspect, a circuit board is provided. The circuit board is an uncut substrate, and there is a cutting region on an edge of the circuit board. After the circuit board is cut along the cutting region, the substrate in the foregoing shielding structure for a system-in-package is obtained. The circuit board includes a board body. The board body includes a first surface and a second surface that are disposed opposite to each other. The first surface is used to dispose a device. In specific disposing of the circuit board, at least two ground planes are disposed in a stacked manner in the board body. A second ground plane is disposed on the second surface of the board body. At least one ring of ground pads located on an edge of the board body is disposed on the second ground plane. A plurality of ground holes are further disposed in the board body, and the ground holes are arranged along the edge of the board body and are disposed at a plurality of layers. The ground hole is configured to connect the ground planes. An electrical connection between adjacent first ground planes and an electrical connection between the second ground plane and a first ground plane adjacent to the second ground plane are implemented by using the ground hole. In addition, a spacing between adjacent ground holes at a same layer is less than a specified distance. Ground holes at the same layer include at least one ground hole that is partially located outside the cutting region, so that adjacent ground planes in the substrate obtained after the circuit board is cut along the cutting region can be electrically connected by using the ground hole. Furthermore, a distance between ground holes that are on the substrate and that are located at the same layer is less than the specified distance, to ensure that a good Faraday cage can be formed when a shield layer is disposed on the substrate to improve an electromagnetic shielding effect of the shield layer.

In specific disposing of the ground hole, a spacing between ground holes corresponding to the substrate at each layer is less than or equal to 1/20 of a shielding wavelength, to ensure a shielding effect. Specifically, the specified distance is set to 300 μm. That is, the spacing between the ground holes corresponding to the substrate at each layer is less than 300 μm, to improve a shielding effect when the shield layer is disposed.

In specific disposing of the ground hole at each layer, the ground holes include at least one ground hole that is partially located in the cutting region, to ensure that there is a ground hole that can be cut during cutting. In this way, an area of metal exposed on a side surface of the substrate formed after cutting is increased, to increase an electrical connection area when the shield layer is grounded, reducing a ground resistance, and improving a shielding effect.

In specific disposing, the plurality of ground holes include at least one ground hole whose distance from a side surface of the circuit board is less than 100 μm, to ensure that there is a ground hole that can be cut during cutting.

In specific disposing of the ground hole, the ground holes include a first ground hole and a second ground hole. A diameter of the first ground hole is greater than a diameter of the second ground hole, to ensure that there are at least some ground holes that are exposed after the circuit board is cut.

In specific disposing of the ground hole, the first ground hole and the second ground hole are arranged in a staggered manner, to ensure that there are at least some ground holes that are exposed after the circuit board is cut.

In specific disposing of the ground hole, a vertical distance between a center of the first ground hole and a side edge of the board body is different from a vertical distance between a center of the second ground hole and the side edge of the board body.

In specific disposing of the ground hole, the ground holes include a plurality of rows of ground holes that are inclined with respect to the side edge of the board body, to ensure that there are at least some ground holes that are exposed after the circuit board is cut.

In specific disposing of the board body, there is a first stress relief region corresponding to at least one side wall of the substrate on the board body, to reduce stress on the board body. For example, in a specific implementation solution, each side wall of the substrate corresponds to the first stress relief region, and the first stress relief region is located at a middle position of a side wall of the board body.

In specific disposing of the board body, there is a second stress relief region corresponding to at least one corner of the substrate on the board body. For example, in a specific implementation solution, each corner corresponds to the second stress relief region.

In specific disposing of the ground pad, ground pads included in the at least one ring of ground pads are electrically connected by using a copper wire.

In a specific implementation solution, a diameter of the ground hole is greater than or equal to 50 μm and less than or equal to 300 μm, to ensure a good conductive effect.

When the ground holes include the first ground hole and the second ground hole with different diameters, the diameter of the first ground hole is greater than or equal to 100 μm and less than or equal to 300 μm, and the diameter of the second ground hole is greater than or equal to 50 μm and less than or equal to 150 μm.

According to a third aspect, an electronic device is provided. The electronic device includes the foregoing shielding structure for a system-in-package. At least two layers of ground holes are disposed in a substrate, and the ground holes are arranged along an edge of the substrate, and connect two adjacent ground planes in at least two first ground planes and a second ground plane, to reduce a ground resistance by using the disposed ground holes. In addition, a spacing between adjacent ground holes is less than a specified distance, so that the ground holes can form a good Faraday cage, to improve an electromagnetic shielding effect of a shield layer. Furthermore, electromagnetic interference at a bottom of the substrate is avoided by using the disposed second ground plane and at least one ring of disposed ground pads, to improve a shielding effect.

DESCRIPTION OF EMBODIMENTS

To make the objectives, technical solutions, and advantages of this application clearer, the following further describes this application in detail with reference to the accompanying drawings.

To facilitate understanding of a shielding structure for a system-in-package provided in the embodiments of this application, an application scenario of the shielding structure for a system-in-package is first described. The shielding structure for a system-in-package may be applied to a SIP package or a non-SIP package with conformal shielding or compartment shielding of an electronic digital product such as a mobile phone, a wearable device, or a tablet, for example, a power module or a radio frequency module in the mobile phone. During use, a device needs to be disposed on a circuit board, and then the device is packaged by a shield layer. To implement shielding, the shield layer needs to be grounded. When the shielding structure for a system-in-package is used, there may be signal interference on a side wall of the circuit board or a surface of the circuit board. To improve a shielding effect of the shield layer, the embodiments of this application provide a shielding structure for a system-in-package. The following describes the shielding structure for a system-in-package in detail with reference to accompanying drawings.

For the shielding structure for a system-in-package provided in the embodiments of this application, in preparation, a circuit board is first prepared, then a device is packaged on the circuit board, and then the circuit board is cut to form a substrate in the shielding structure for a system-in-package. To facilitate understanding of the substrate, the following first describes a structure of the circuit board before the substrate is formed after cutting.

Figure 1:
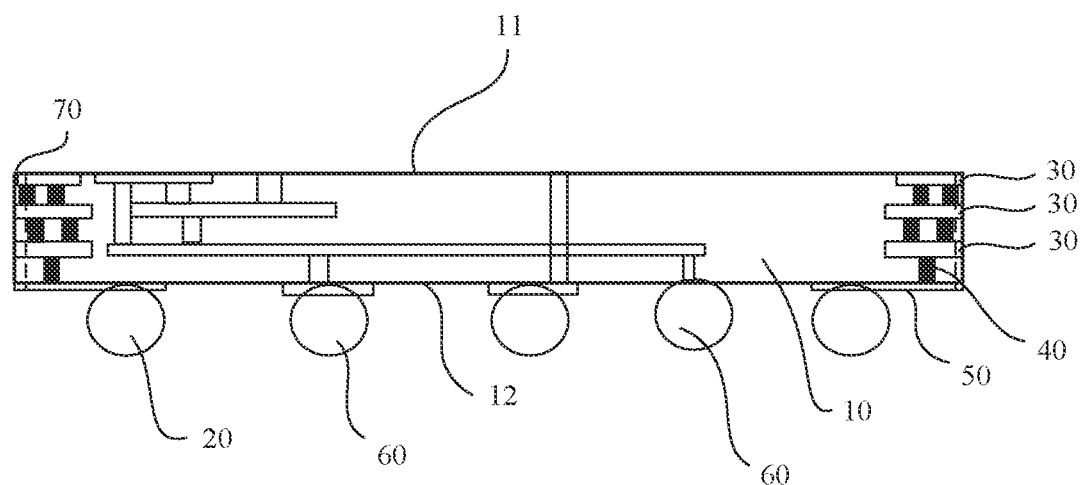
FIG. 1 is a schematic structural diagram of a circuit board according to an embodiment of this application.
Figure 2:
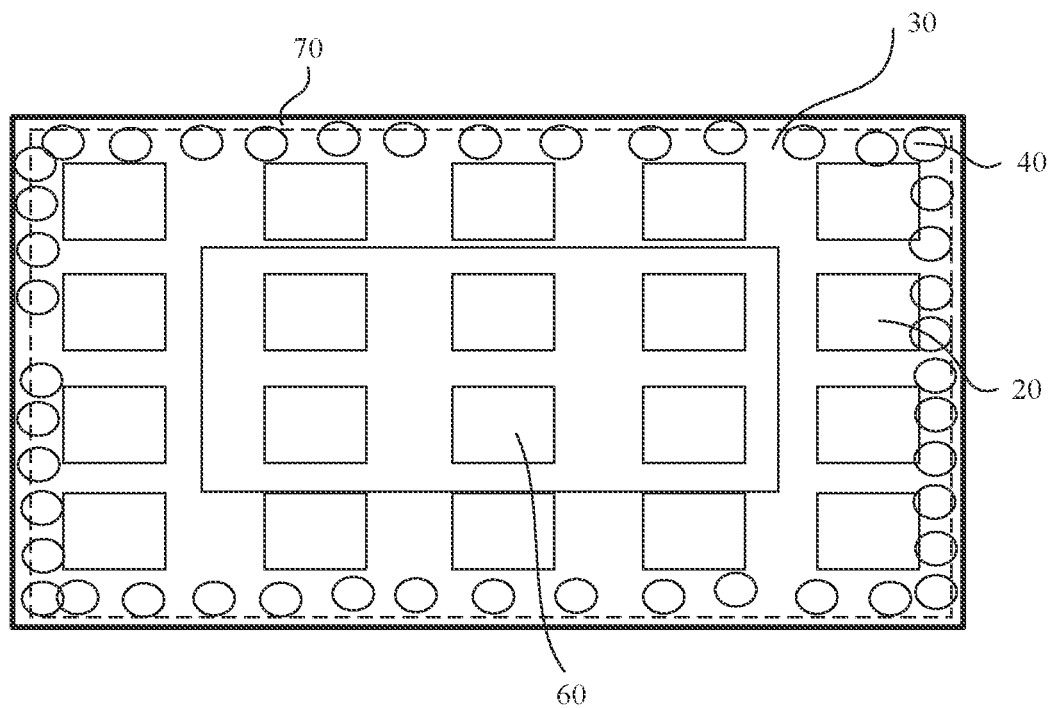
FIG. 2 is a bottom view of a circuit board according to an embodiment of this application.

FIG. 1 is a schematic structural diagram of a circuit board, and FIG. 2 is a bottom view (a view in a bottom-to-top direction of the schematic structural diagram of the circuit board shown in FIG. 1) of the circuit board. First, referring to FIG. 1, there is a cutting region 70 on an edge of the circuit board provided in this embodiment of this application. The cutting region 70 is a position at which a cutter is used to cut the circuit board. The cutting region 70 has a width due to a thickness of the cutter and an error that occurs during cutting. It may be learned from FIG. 2 that cutting regions 70 on edges of the circuit board are connected to form a ring. The cutting region 70 shown in FIG. 2 is a region surrounded by continuous thick lines and dashed lines. The cutting region 70 is cut off when the circuit board is cut. Referring to FIG. 1, when the circuit board includes a plurality of layers, a structure corresponding to the cutting region 70 at each layer is cut off. In addition, a structure formed after the circuit board is cut is a substrate in a shielding structure for a system-in-package.

Further referring to FIG. 1 and FIG. 2, the circuit board includes a board body 10. The board body 10 includes two surfaces that are disposed opposite to each other: a first surface 11 and a second surface 12. The first surface 11 is used to carry a device. In specific disposing of the device, the device is fastened on the first surface 11. Specifically, the device may be fastened on the first surface through welding or bonding. After the device is fastened, the device is electrically connected to a circuit on the circuit board. The second surface 12 is used to dispose a pad. A pad disposed on the second surface 12 is shown in FIG. 2. FIG. 2 is a schematic distribution diagram of pads corresponding to the substrate. The pads may be classified into a ground pad 20 and a signal pad 60 based on functions. There is at least one ring of ground pads 20. The at least one ring of ground pads 20 is disposed around an edge of the board body 10. In disposing of the ground pad 20, the ground pad 20 is located outside the cutting region 70, to ensure that the ground pad can remain on the substrate after cutting. In a structure shown in FIG. 2, there is one ring of ground pads 20, and the one ring of ground pads 20 includes a plurality of ground pads 20 arranged at an interval. In specific disposing of the plurality of ground pads 20, the plurality of ground pads 20 may be arranged at an equal spacing, as shown in FIG. 2. Alternatively, the plurality of ground pads 20 may be arranged at unequal spacings. However, it should be understood that regardless of a manner that is used, it is not limited in this embodiment of this application that there is one ring of ground pads 20, and there may be a different quantity of rings such as two rings or three rings of ground pads 20. When there is sufficient space on the second surface 12, a different quantity of rings of ground pads 20 may be added. In addition, a ring of second ground planes 50 that surround the substrate is disposed on the second surface 12. The second ground plane 50 is disposed around the edge of the board body 10. The at least one ring of ground pads 20 is disposed on the second ground plane 50 and electrically connected to the second ground plane 50. In this case, ground pads included in the at least one ring of ground pads 20 are electrically connected by using the second ground plane 50. In preparation of the shielding structure for a system-in-package, a shield layer is electrically connected to the second ground plane 50. When there is signal interference on the second surface 12 of the substrate, electromagnetic interference on the second surface 12 may be avoided by using the disposed second ground plane 50. In addition, the at least one ring of ground pads 20 is disposed for grounding, to improve a grounding effect. In comparison with a substrate in the prior art, to facilitate cabling, many strong signal sources are distributed around a bottom of the substrate. In this case, signal interference is prone to occur. However, in the substrate provided in this embodiment of this application, a ring of ground pads 20 is disposed at a bottom, and the second ground plane 50 is disposed around the ground pad 20, to limit an interference source to a center of the system-in-package. In this way, a good electromagnetic shield is formed. In addition, to provide the ground pad 20 with a grounding effect, in disposing of the at least one ring of ground pads 20, the ground pads included in the at least one ring of ground pads 20 are electrically connected. Specifically, a copper wire (not shown in the figure) may be disposed on the second surface 12, and the ground pads 20 are electrically connected by using the copper wire. Certainly, electrical connection may be implemented by using another known conductor. In this way, the plurality of ground pads 20 can be grounded, to improve a grounding effect.

In specific disposing of the second ground plane 50 on the second surface 12, the second ground plane 50 may be disposed as required. The second ground plane 50 may be laid on an edge of the second surface 12. After the substrate is formed after cutting, the second ground plane 50 may be exposed on a side surface of the substrate. In this way, in preparation of the shielding structure for a system-in-package, the shield layer may be electrically connected to the second ground plane 50. Certainly, there may be a specific distance between the second ground plane 50 and the edge of the second surface 12. In this case, in preparation of the shielding structure for a system-in-package, the shield layer is not directly electrically connected to the second ground plane 50, and there is a specific gap between the shield layer and the second ground plane 50. However, it should be noted that the gap should be less than 300 microns (μm) to avoid signal leakage and ensure a shielding effect.

In addition to the second ground plane 50 disposed on the second surface 12, the circuit board includes a plurality of first ground planes 30 located in the board body 10. The first ground plane 30 is disposed around the edge of the board body 10 and extends beyond the cutting region 70, to ensure that there is the first ground plane 30 in the substrate formed after cutting. To improve a grounding effect, a plurality of first ground planes are disposed in the board body 10, and the plurality of first ground planes 30 are electrically connected. To implement a connection between the plurality of first ground planes 30, the plurality of first ground planes 30 are electrically connected by using a ground hole 40. Further referring to FIG. 1, it may be learned from FIG. 1 that a plurality of ground holes 40 are disposed in the board body 10, and the plurality of ground holes 40 are arranged at a plurality of layers in a thickness direction (a direction from the first surface 11 to the second surface 12) of the board body 10. A ground hole 40 at each layer is a ground hole between two ground planes (between two first ground planes 30 or between the first ground plane 30 and the second ground plane 50). The ground hole 40 at each layer electrically connects two adjacent first ground planes 30. In addition, the first ground plane 30 is electrically connected to the second ground plane 50 by using the disposed ground hole 40. In other words, it is specified that both an electrical connection between adjacent first ground planes 30 and an electrical connection between the second ground plane 50 and a first ground plane 30 adjacent to the second ground plane 50 are implemented by using the ground hole 40. In addition, there are a plurality of ground holes at each layer, to reduce a resistance between two connected ground planes and improve a grounding effect. To ensure that adjacent ground planes on the substrate are electrically connected by using the ground hole 40 after the circuit board is cut into the substrate, in disposing of the ground hole 40 at each layer, ground holes 40 at a same layer include at least one disposed ground hole 40 that is partially located outside the cutting region 70, so that when the cutting region 70 is cut off there is at least a ground hole 40 that can connect the adjacent ground planes (the adjacent first ground planes 30 or the second ground plane 50 and the first ground plane 30 adjacent to the second ground plane 50). In addition, to ensure a connection effect between the adjacent ground planes, in specific disposing of the ground hole, a diameter of the ground hole provided in this embodiment of this application is greater than or equal to 50 μm and less than or equal to 300 μm. For example, in specific disposing, the diameter of the ground hole is 50 μm, 100 μm, 150 μm, 200 μm, 250 μm, or 300 μm.

In addition, in disposing of the ground hole 40 at each layer, the plurality of ground holes 40 at the same layer are arranged in a ring along the edge of the board body 10, and a distance between adjacent ground holes 40 is less than a specified distance, to ensure that a good Faraday cage can be formed when the shield layer is disposed on the substrate to improve an electromagnetic shielding effect of the shield layer. Specifically, the specified distance is set to 1/20 of a shielding wavelength, to ensure a shielding effect. For an actual value of the specified distance, the specified distance is set to 300 μm. That is, a spacing between ground holes 40 corresponding to the substrate at each layer is less than 300 μm, to improve a shielding effect when the shield layer is disposed.

In addition, to improve a grounding effect of the ground plane, in disposing of the ground hole 40 at different layers, staggered or non-staggered ground holes 40 may be disposed at the different layers. In either case, a conductive effect between the first ground planes 30 can be improved, to reduce a ground resistance. As shown in FIG. 1, the first ground plane 30 and the ground hole 40 are alternately disposed, and the plurality of first ground planes 30 are electrically connected to the at least one ring of ground pads 20 by using the plurality of ground holes 40. The second ground plane 50 is disposed on the second surface 12, and the ground hole 40 is connected to the ground pad 20 by using the second ground plane 50, to reduce the ground resistance by using the ground holes 40 disposed at a plurality of layers, the first ground plane 30, and the second ground plane 50. Therefore, when the shield layer is disposed, a grounding effect of the shield layer is improved.

To facilitate understanding of the circuit board provided in this embodiment of this application, the following describes a preparation process of the circuit board. In specific preparation of the circuit board, first, a dielectric layer is laid, a ring of first ground planes 30 and a ring of second ground planes 50 that surround two surfaces of the dielectric layer are respectively formed on the surfaces of the dielectric layer through vapor deposition or etching, and then a ring of ground holes 40 that surround the dielectric layer is disposed on the first ground plane 30. The ground hole 40 electrically connects the first ground plane 30 and the second ground plane 50. Then, another dielectric layer is laid, another ring of first ground planes 30 is formed on the dielectric layer through vapor deposition or etching, and then a ring of ground holes 40 that surround the dielectric layer is disposed on the first ground plane 30. The ground hole 40 electrically connects two first ground planes 30. Similarly, the ground plane and the ground hole 40 are alternately formed in the foregoing manner until the entire circuit board is prepared.

In the foregoing structure, it may be learned from FIG. 2 that a conductive area during grounding is increased and ground return impedance is effectively reduced by using the plurality of disposed first ground planes 30 and the ground holes 40 that are disposed in a staggered manner. In addition, one or more rings of ground pads 20 are added at the bottom, and therefore leakage problems on a side wall of the substrate and the second surface 12 can be reduced.

Further referring to FIG. 2, in disposing of the ground hole 40 corresponding to the substrate at each layer, the ground holes 40 include at least one ground hole 40 that is partially located outside the cutting region 70. Therefore, when the circuit board is cut, some ground holes 40 are cut, and inner walls of the ground holes 40 are exposed on the side surface of the substrate formed after cutting. In forming of the shielding structure for a system-in-package, the shield layer may be electrically connected to the exposed inner walls of the ground holes 40. In this way, the conductive area during grounding can be increased, and the ground resistance of the shield layer is reduced, to improve a shielding effect. To ensure that there is a ground hole 40 that can be cut during cutting, in specific disposing of the ground hole 40, the ground holes 40 include at least one ground hole 40 whose distance from a side surface of the circuit board is less than 100 μm.

Specifically, there may be different manners to implement that the disposed ground hole 40 can be cut. An arrangement manner of the ground holes 40 provided in this embodiment of this application is described in detail below with reference to the accompanying drawings.

Figure 3:
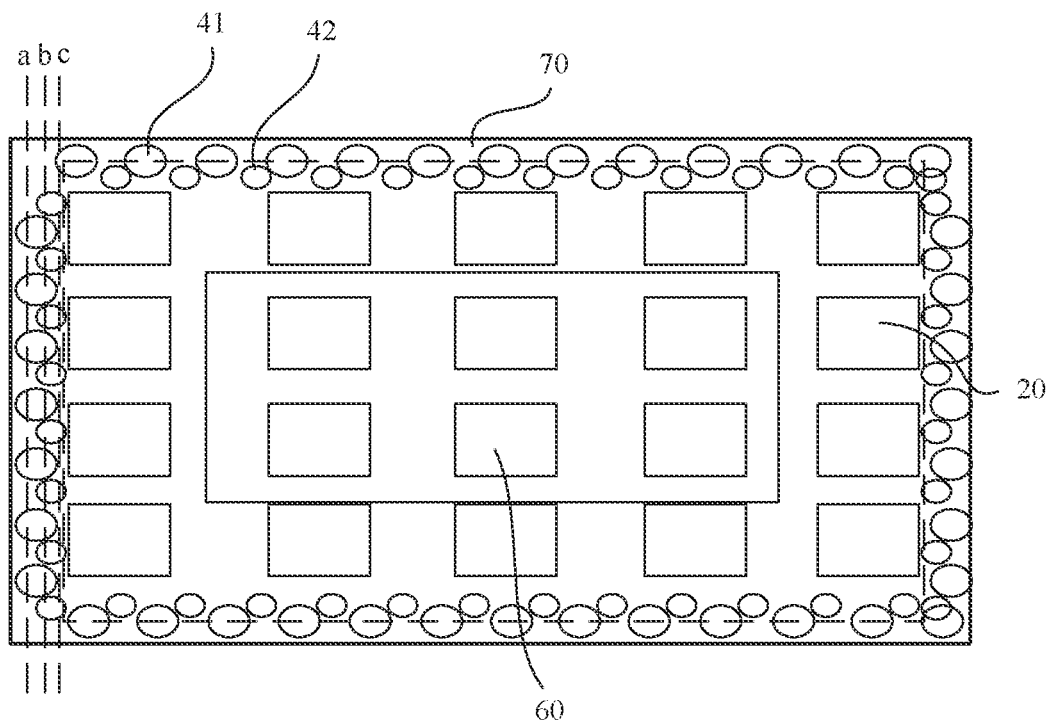
FIG. 3 is another bottom view of a circuit board according to an embodiment of this application.

In specific forming of the plurality of ground holes 40, the plurality of ground holes 40 may be arranged in different manners. As shown in FIG. 3, in a structure shown in FIG. 3, ground holes 40 at a same layer include a first ground hole 41 and a second ground hole 42. A diameter of the first ground hole 41 is greater than a diameter of the second ground hole 42. For example, the diameter of the first ground hole 41 is greater than or equal to 100 μm and less than or equal to 300 μm, and the diameter of the second ground hole 42 is greater than or equal to 50 μm and less than or equal to 150 μm. For example, the diameter of the first ground hole 41 is 200 μm, and the diameter of the second ground hole 42 is 100 μm; or the diameter of the first ground hole 41 is 150 μm, and the diameter of the second ground hole 42 is 80 μm; or the diameter of the first ground hole 41 is 150 μm, and the diameter of the second ground hole 42 is 50 μm. In addition, in specific disposing, at least one of the first ground hole 41 and the second ground hole 42 is partially located in the cutting region 70. In the structure shown in FIG. 3, there are large and small ground holes on each edge of the circuit board. In other words, the first ground hole 41 and the second ground hole 42 are disposed on each edge of the board body 10. In addition, in specific disposing of the first ground hole 41 and the second ground hole 42, a vertical distance between a center of the first ground hole 41 and a side edge of the board body 10 is different from a vertical distance between a center of the second ground hole 42 and the side edge of the board body 10. In the structure shown in FIG. 3, the vertical distance between the first ground hole 41 and the side edge of the board body 10 is less than the vertical distance between the second ground hole 42 and the side edge of the board body 10. Therefore, when the circuit board is cut into the substrate, it can be ensured that the cutter can cut into the first ground hole 41 or the second ground hole 42, so that there are at least some ground holes whose inner walls are exposed on the substrate formed after cutting. In disposing of the shield layer on the substrate, the shield layer may be electrically connected to the exposed inner wall of the ground hole (the first ground hole 41 or/and the second ground hole 42), to improve a shielding effect. In addition, to ensure uniformity of the exposed inner walls of the ground holes formed after cutting, in disposing of the first ground hole 41 and the second ground hole 42, the first ground hole 41 and the second ground hole 42 are arranged in a staggered manner. The structure shown in FIG. 3 is used as an example. When a first cutting line (dashed line a) is used, after the first ground hole 41 is cut, inner walls of some ground holes are exposed on the side wall of the substrate, and the second ground hole 42 is not cut. Therefore, in subsequent disposing of the shield layer, the shield layer is electrically connected to the first ground hole 41, and is electrically connected to the first ground plane 30 by using the first ground hole 41, to implement grounding. When a second cutting line (dashed line b) is used, after the first ground hole 41 and the second ground hole 42 are cut, inner walls of some ground holes are exposed on the side wall of the substrate. Therefore, in subsequent disposing of the shield layer, the shield layer is electrically connected to the first ground hole 41 and the second ground hole 42, and is electrically connected to the first ground plane 30 by using the first ground hole 41 and the second ground hole 42, to implement grounding. When a third cutting line (dashed line c) is used, after the second ground hole 42 is cut, inner walls of some ground holes are exposed on the side wall of the substrate, and the first ground hole 41 is cut off. Therefore, in subsequent disposing of the shield layer, the shield layer is electrically connected to the second ground hole 42, and is electrically connected to the first ground plane 30 by using the second ground hole 42, to implement grounding.

It may be learned from the foregoing description that when the first ground hole 41 and the second ground hole 42 are used and when an error occurs in a process of forming the substrate through cutting, a cutting range is enlarged by using large and small holes and the first ground hole 41 and the second ground hole 42 that are disposed in the staggered manner. In this way, it is ensured that when an error occurs, there are more ground holes whose inner walls can be exposed on the side wall of the substrate. Therefore, the cutting range is enlarged.

Figure 4:
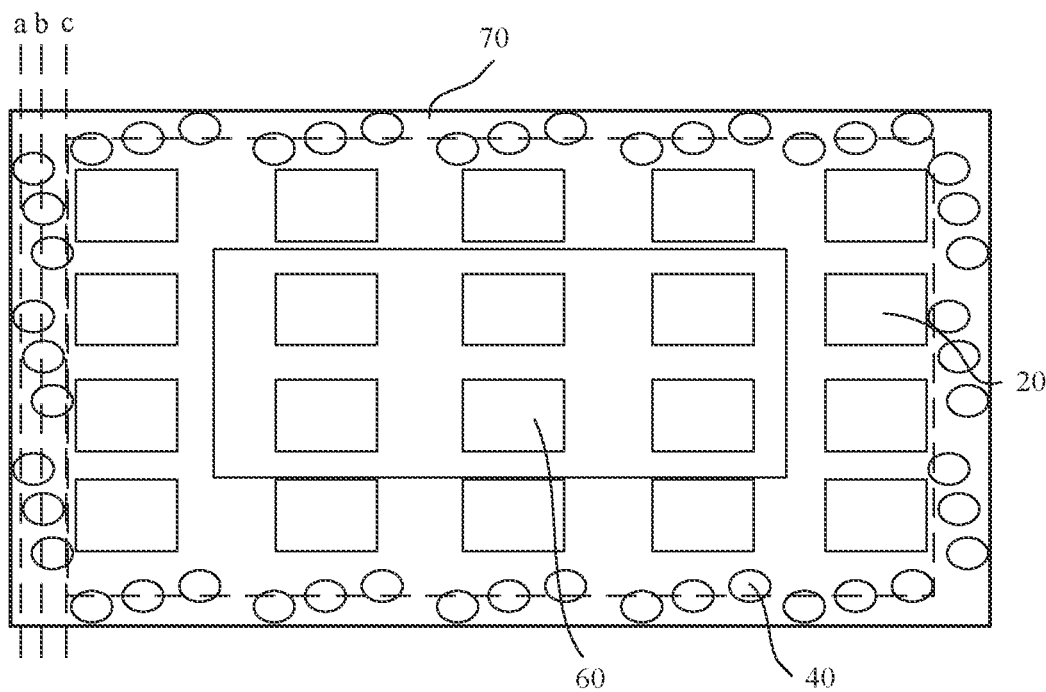
FIG. 4 is another bottom view of a circuit board according to an embodiment of this application.

To improve a cutting effect, a manner other than the foregoing arrangement manner of large and small holes may be used. As shown in FIG. 4, ground holes 40 at a same layer include a plurality of rows of ground holes 40 that are arranged in an inclined manner with respect to the side edge of the board body 10. At least one ground hole 40 in the plurality of rows of ground holes 40 is partially located in the cutting region 70. In a structure shown in FIG. 4, ground holes 40 corresponding to each edge of the board body 10 are arranged in a plurality of rows, and are arranged in the inclined manner with respect to the side edge and a side wall of the board body 10. Ground holes 40 corresponding to one edge are used as an example. In disposing of the ground holes 40, three ground holes 40 are arranged in a row, and the plurality of rows of ground holes 40 are disposed in the inclined manner. In specific disposing of the ground holes 40 in the inclined manner, for ground holes 40 in a variable period of inclination, a deviation width is a width of the cutter. During cutting, the ground hole 40 can be cut by using each of a first cutting line (dashed line a), a second cutting line (dashed line b), and a third cutting line (dashed line c) shown in FIG. 4. Therefore, when this manner is used, an error that occurs during cutting may be increased, and it can be ensured that there are some ground holes 40 that are exposed provided that a cutting line is located between the first cutting line and the third cutting line. It should be understood that in the structure shown in FIG. 4, although the ground holes 40 are disposed with a same size, the ground holes 40 provided in this embodiment of this application may differ in size and diameter. In other words, in the structure shown in FIG. 4, in a row of ground holes 40 that are disposed in the inclined manner, different ground holes 40 have different diameters and sizes.

Figure 5:
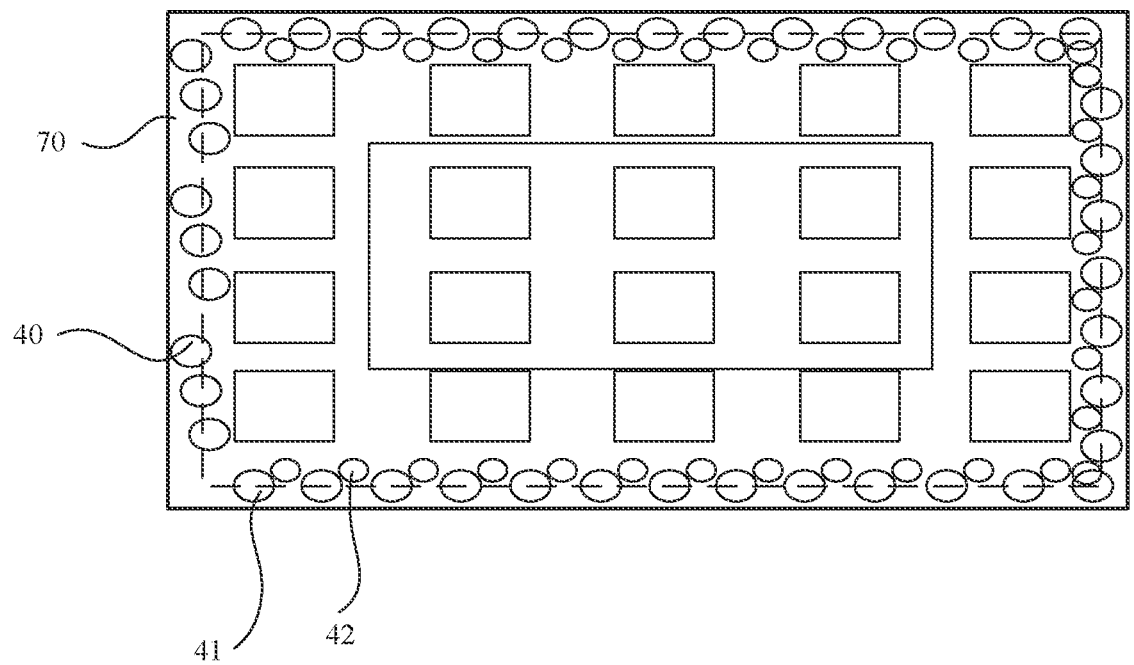
FIG. 5 is another bottom view of a circuit board according to an embodiment of this application.

In addition to the structures shown in FIG. 3 and FIG. 4, to ensure that there is a ground hole 40 that can be exposed during cutting, the ground holes 40 may be disposed by combining the structures shown in FIG. 3 and FIG. 4. As shown in FIG. 5, in specific disposing of the ground hole 40, in a plurality of ground holes 40 corresponding to side edges of the board body 10, a plurality of ground holes 40 corresponding to one side edge are arranged in the inclined manner with respect to the side edge of the board body 10 in a plurality of rows, and a plurality of ground holes 40 corresponding to the other side edges include a ground hole 40 with a relatively large diameter and a ground hole 40 with a relatively small diameter. In other words, the ground holes 40 corresponding to the one side edge are disposed in the manner that is of disposing ground holes 40 corresponding to one side edge and that is shown in FIG. 4, and the ground holes 40 corresponding to the other side edges are disposed in the manner that is of disposing ground holes 40 and that is shown in FIG. 3. Specifically, when large and small holes are used for disposing, a manner of superimposing one large hole and one or two small holes may be used. If there is a relatively large offset during slicing and the shielding wavelength meets a requirement, based on ground holes 40 shown on a right side in FIG. 5, 2 to N ground holes 40 may be distributed in a staggered manner on a right side edge, and a step for staggering is as small as possible. In addition, when the edge of the board body 10 is wide enough, two rows or a plurality of rows of holes may be disposed to improve electromagnetic shielding. Certainly, a manner of a row of large holes (the first ground hole 41) and a row of small holes (the second ground hole 42) may alternatively be used. In each of the foregoing manners, it can be ensured that there are some ground holes 40 that are exposed. Certainly, a structure shown in FIG. 5 is merely a specific example. In the circuit board provided in this embodiment of this application, ground holes 40 on two edges may be disposed in the manner of ground holes 40 shown in FIG. 4, and ground holes 40 on the other two edges may be disposed in the manner of ground holes 40 shown in FIG. 3.

It should be understood that only several specific implementations are listed in FIG. 3, FIG. 4, and FIG. 5 to increase a coverage area of the ground hole 40, so as to ensure that there are some ground holes 40 that can be exposed during cutting. It may be learned from FIG. 3, FIG. 4, and FIG. 5 that in center lines of a plurality of ground holes 40 corresponding to each side wall of the board body 10, vertical distances between center lines of at least two ground holes 40 and a corresponding edge of the substrate are different. In this way, the ground holes 40 can be disposed in a staggered manner. In addition, in the ground holes 40 corresponding to each side wall of the board body 10, there are at least two ground holes whose maximum vertical distances from the side wall of the board body 10 are different to increase the coverage area of the disposed ground hole 40, so as to ensure that there is a ground hole 40 that can be exposed during cutting.

It may be learned from the foregoing description that the spacing between the ground holes 40 provided in this embodiment of this application is less than or equal to ½0 of the shielding wavelength, and vias (ground holes 40), including dense vias, a design of staggered vias, and a design of a combination of large and small holes, around the circuit board are designed to ensure a connection between the surrounding vias and the shield layer. In this way, ground impedance can be reduced, and shielding effectiveness is improved. In addition, a cage-type electromagnetic shield is formed.

In addition, for the circuit board provided in this application, the plurality of first ground planes 30 are disposed in the board body 10, and the adjacent first ground planes 30 are electrically connected by using the ground hole 40. In addition, the second ground plane 50 is disposed on the second surface 12 of the board body 10. During conduction, the plurality of first ground planes 30, the second ground plane 50, and the ground hole 40 may form a top-down heat dissipation channel, which is more advantageous for a SIP with a heat dissipation requirement.

Figure 6:
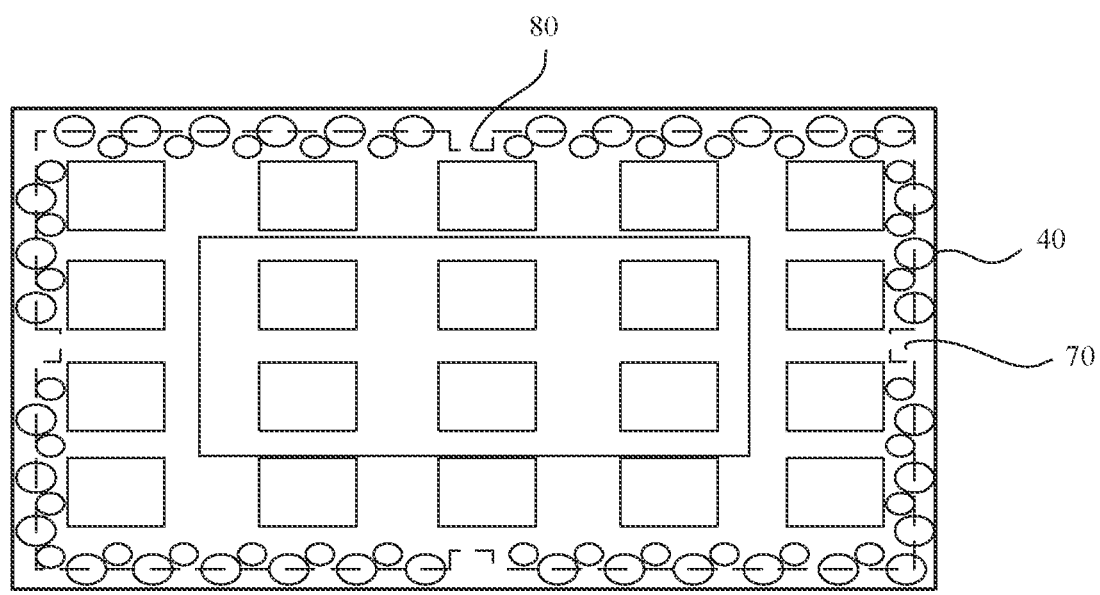
FIG. 6 is another bottom view of a circuit board according to an embodiment of this application.

For the circuit board provided in this embodiment of this application, a stress concentration region is inevitably generated during slicing (a process of cutting the circuit board into the substrate). To reduce impact of stress on the substrate, a stress relief region is disposed on the circuit board provided in this embodiment of this application. As shown in FIG. 6, there is a first stress relief region 80 corresponding to at least one side wall of the substrate on the board body 10, to reduce stress on the substrate. For example, in a specific implementation solution, the first stress relief region 80 is disposed on each side wall of the substrate, and the first stress relief region 80 is a rectangular notch. Certainly, the first stress relief region 80 shown in FIG. 6 is merely an example. The first stress relief region 80 provided in this embodiment of this application may alternatively be a structure in another shape, for example, an elliptical notch or a triangular notch. The impact of the stress on the substrate can be reduced provided that the first relief region 80 is disposed in a corresponding stress concentration region (a middle position of the side wall of the substrate). Certainly, the first stress relief region 80 is disposed on each side wall shown in FIG. 6. However, actually, the stress relief region may be correspondingly disposed based on a detected stress concentration position, and is not limited to a structure shown in FIG. 6. In addition, in disposing of the ground hole 40, as shown in FIG. 6, the ground holes 40 corresponding to each side edge of the substrate are arranged on both sides of a first stress relief region 80 on the side edge.

Figure 7:
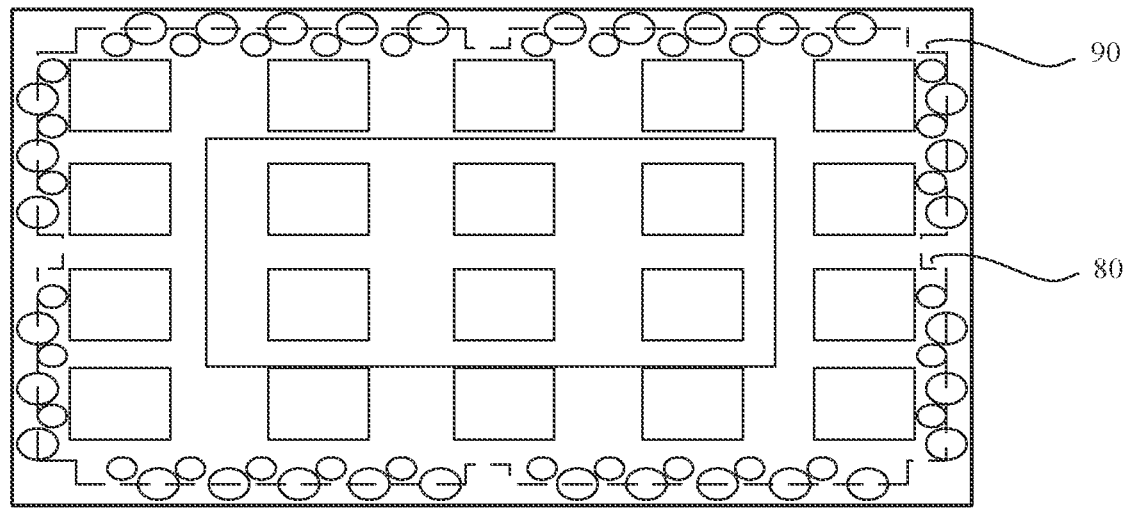
FIG. 7 is another bottom view of a circuit board according to an embodiment of this application.

Referring to FIG. 7, in a structure shown in FIG. 7, there is a second stress relief region 90 corresponding to at least one corner of the substrate on the board body 10. In an implementation solution shown in FIG. 7, the second stress relief region 90 is disposed on each corner. The second stress relief region 90 is disposed to alleviate impact of stress concentration on the corner on the substrate.

It may be learned from the structures shown in FIG. 6 and FIG. 7 that in the circuit board provided in this embodiment of this application, metal opening regions (the first stress relief region 80 and the second stress relief region 90) are properly added to all surrounding metal that is grounded. In this way, stress and reliability problems caused by edge cutting can be effectively reduced, and contact resistance reduction and a corresponding reliability problem caused by an unsmooth board edge can be avoided. Therefore, reliability of the generated circuit board during shielding is improved.

Figure 8:
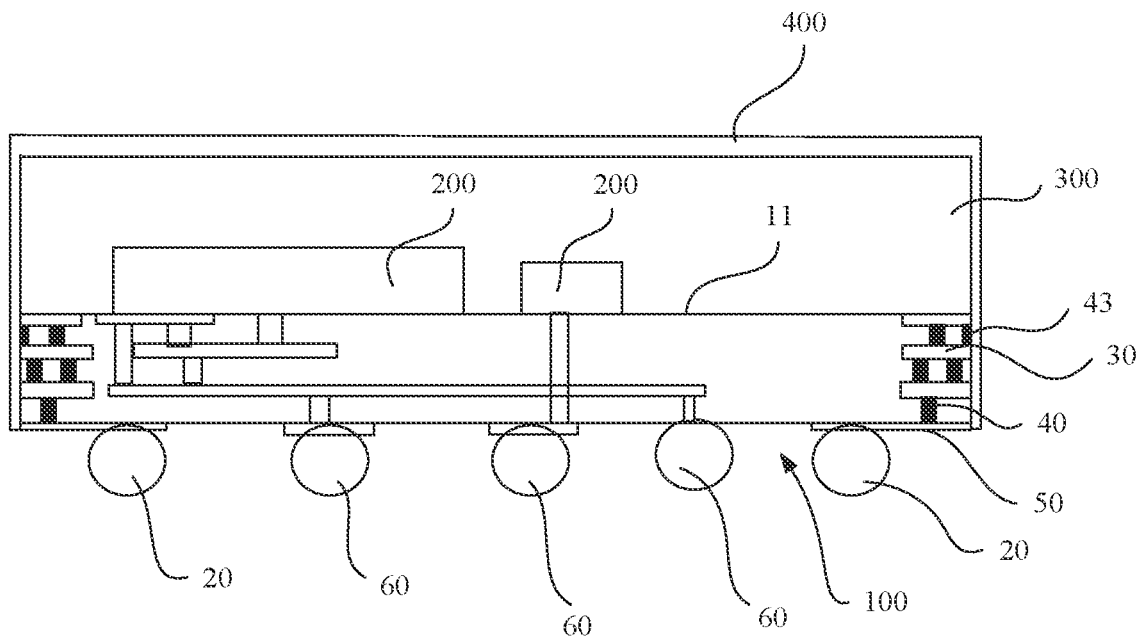
FIG. 8 is a schematic structural diagram of a shielding structure for a system-in-package according to an embodiment of this application.

As shown in FIG. 8, an embodiment of this application further provides a shielding structure for a system-in-package. The shielding structure for a system-in-package may be applied to a SIP or a non-SIP package with conformal shielding or compartment shielding of an electronic digital product such as a mobile phone, a wearable device, or a tablet, for example, a power module or a radio frequency module in the mobile phone.

In specific disposing of the shielding structure for a system-in-package, the shielding structure for a system-in-package includes a substrate 100 formed after the foregoing circuit board is cut and a device 200 disposed on the substrate 100. In disposing of the device 200, the device 200 is packaged by a package layer 300 and is wrapped by a shield layer 400, to improve a shielding effect of the shielding structure for a system-in-package. A grounding effect is improved in the substrate 100 provided in this application. Two opposite surfaces, namely, a first surface 11 and a second surface 12, of the substrate 100 are defined for ease of description. The device 200 is disposed on the first surface 11 of the substrate 100. A second ground plane 50 that surrounds an edge of the substrate 100 is disposed on the second surface 12 of the substrate 100. At least one ring of ground pads arranged along the edge of the substrate 100 is disposed on the second ground plane 50. In addition, at least two stacked first ground planes 30 are disposed in the substrate 100, and the ground plane is disposed around the edge of the substrate 100. When the shield layer 400 wraps the package layer 300, the shield layer 400 extends to the substrate 100, and a part that extends to the substrate 100 is electrically connected to the first ground plane 30 for grounding. To reduce a ground resistance, a plurality of ground holes 40 are disposed in the substrate 100, and the ground holes 40 are arranged along the edge of the substrate 100 and are disposed at a plurality of layers. A spacing between adjacent ground holes 40 at a same layer is less than a specified distance, so that the ground holes 40 can form a good Faraday cage, to improve an electromagnetic shielding effect of the shield layer 400. In addition, an electrical connection between adjacent first ground planes 30 and an electrical connection between the second ground plane 50 and a first ground plane 30 adjacent to the second ground plane 50 are implemented by using the ground hole 40, so that the ground hole 40 electrically connects two adjacent ground planes in the first ground planes 30 and the second ground plane 50, to reduce the ground resistance. Furthermore, electromagnetic interference at a bottom of the substrate 100 is avoided by using the disposed second ground plane 50 and the at least one ring of disposed ground pads 20, to improve a shielding effect. To improve a grounding effect, ground pads included in the at least one ring of grounding pads 20 may be electrically connected by using a copper wire to reduce the ground resistance of the shield layer 400, so as to improve a shielding effect. For a structure of the substrate 100, refer to the foregoing description of the circuit board. The substrate 100 may be obtained after the circuit board is cut along a cutting region.

For specific disposing of the adjacent ground holes 40, refer to the foregoing description. For example, in a specific implementation solution, the specified distance is 300 μm.

In specific implementation of an electrical connection between the shield layer 400 and the ground plane, as shown in FIG. 8, the part, of the shield layer 400, that extends to the substrate 100 may be electrically connected to the first ground plane 30 and the second ground plane 50 to increase a connection area between the shield layer 400 and the ground plane and reduce the ground resistance, so as to improve a shielding effect at the bottom of the substrate 100. Certainly, the shield layer 400 may alternatively be in a structure shown in FIG. 9. In this case, the shield layer 400 is electrically connected only to the first ground plane 30, and there is a gap between the shield layer 400 and the second ground plane 50. The gap should be less than 300 μm, to avoid signal leakage and ensure a shielding effect.

For the ground hole, the ground holes on the substrate 100 include a partial ground hole that is formed after cutting and that is exposed on a side surface of the substrate 100 after cutting. For details, refer to FIG. 8. In FIG. 8, when the shield layer 400 extends to the side surface of the substrate 100, the shield layer 400 is electrically connected to partial ground hole 43 to increase the connection area between the shield layer 400 and the ground plane, so as to improve a shielding effect. For a manner of exposing the partial ground hole 43 (a ground hole formed after cutting) on the side surface of the substrate 100, refer to the foregoing description of the circuit board. For the structures shown in FIG. 3 to FIG. 5, the structure shown in FIG. 3 may be used for the circuit board. That is, the ground holes include a first ground hole 41 with a relatively large diameter and a first ground hole 41 with a relatively small diameter. At least one of the first ground hole 41 and the second ground hole 42 is the partial ground hole formed after cutting to increase the connection area between the shield layer 400 and the ground plane, so as to improve a shielding effect. In addition, in specific arrangement, the first ground hole 41 and the second ground hole 42 are arranged in a staggered manner to increase the connection area between the shield layer 400 and the ground plane, so as to improve a shielding effect. Furthermore, a plurality of rows of first ground holes 41 and second ground holes 42 may be arranged. In this case, a vertical distance between a center of the first ground hole 41 and the side surface of the substrate 100 is different from a vertical distance between a center of the second ground hole 42 and the side surface of the substrate 100 to increase the connection area between the shield layer 400 and the ground plane, so as to improve a shielding effect.

Certainly, the structure shown in FIG. 4, that is, the ground holes include a plurality of rows of ground holes that are arranged in an inclined manner with respect to the edge of the substrate, may be used. In addition, ground holes in each row include a partial ground hole that is formed after cutting and that is exposed on the side surface of the substrate to increase the connection area between the shield layer 400 and the ground plane, so as to improve a shielding effect. For detailed description, refer to the description of the foregoing circuit board.

Figure 9:
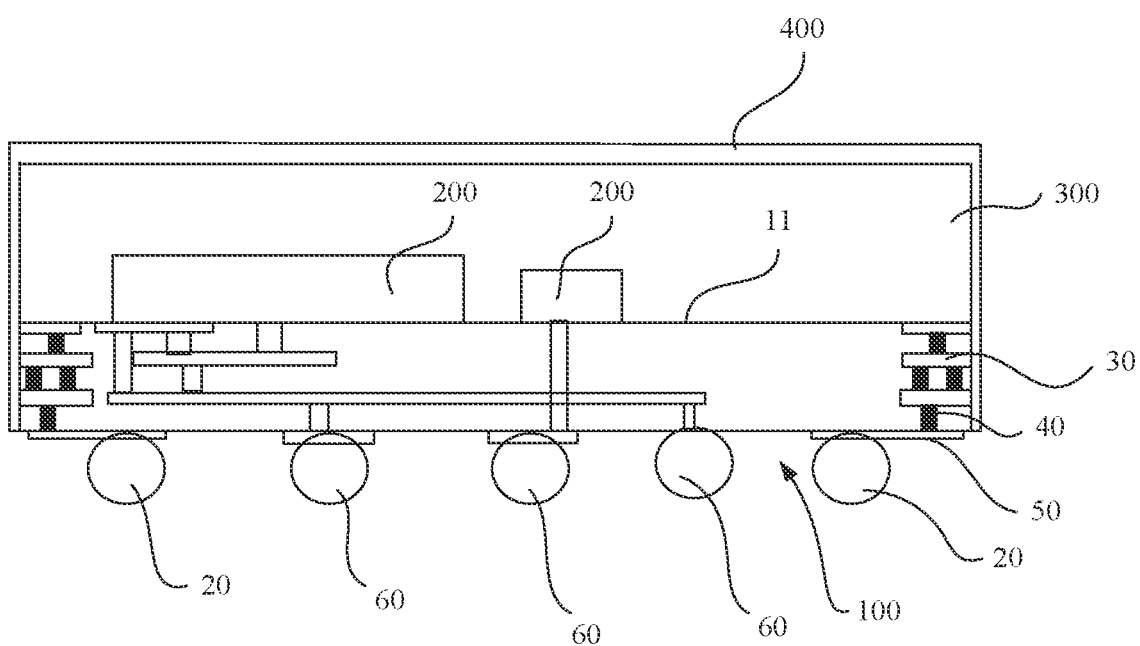
FIG. 9 is another schematic structural diagram of a shielding structure for a system-in-package according to an embodiment of this application.

In addition, in disposing of the shield layer 400, the shield layer 400 may not be electrically connected to the ground hole. As shown in FIG. 9, the ground hole 40 disposed in the substrate 100 formed after cutting is not cut. Therefore, no ground hole is exposed on the side surface of the substrate 100. In disposing of the shield layer 400, the shield layer 400 is electrically connected to the exposed first ground plane 30.

With reference to the description of the stress relief region in the circuit board, as shown in FIG. 6 and FIG. 7, a first stress relief region 80 is disposed on at least one side surface of the substrate in this embodiment of this application, to reduce stress concentration of the substrate after cutting. In addition, the ground holes are disposed on both sides of the first stress relief region 80. Furthermore, a second stress relief region 90 is disposed on at least one corner of the substrate. The second stress relief region 90 is disposed on the corner of the substrate to reduce stress after cutting. For a specific implementation of disposing the stress relief region, refer to the description of the foregoing circuit board.

A camera power module is used as an example. In a power module in the prior art, to facilitate cabling, many strong signal sources are distributed around a bottom of a circuit board, and a shield layer 400 is connected to a surrounding shield layer 400 only by using two metal layers and three ground planes in the circuit board. However, in the circuit board provided in this embodiment of this application, a ring of pads at the bottom is disposed as a GND plane, and a ring of ground loops is disposed around the GND pads, so that an interference source is limited to a center of the system-in-package, and an inner layer is directly punched when a connection to a mainboard is implemented, to alleviate high-frequency signal leakage caused by pad stacking. In addition, to reduce ground impedance of the shield layer 400, a ring of first ground planes 30 is added at each layer of the circuit board, and staggered vias are added on the first ground plane 30, to ensure that there are regular vias connected to the shield layer 400 after the system-in-package is cut and a good electromagnetic shield is formed in a side wall direction.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A shielding structure for a system-in-package, comprising:
    a substrate, wherein the substrate comprises a first surface and an opposing second surface;
    stacked first ground planes disposed in the substrate, wherein each first ground plane is disposed around an edge of the substrate;
    a second ground plane disposed on the second surface, wherein the second ground plane surrounds an edge of the second surface, and wherein the second ground plane comprises a ring of ground pads arranged along the edge of the second surface;
    a plurality of ground holes disposed in the substrate, wherein the ground holes are arranged along an edge of the substrate, wherein the ground holes comprise a first ground hole and a second ground hole, and wherein a diameter of the first ground hole is greater than a diameter of the second ground hole;
    a first electrical coupling between adjacent first ground planes;
    a second electrical coupling between the second ground plane and the first ground plane adjacent to the second ground plane, wherein the first electrical coupling and the second electrical coupling comprise the ground holes;
    a device disposed on the first surface of the substrate, wherein the device comprises a package layer; and
    a shield layer, wherein the shield layer wraps the package layer and extends to the substrate, and wherein the shield layer extends to the substrate and is electrically coupled to the first ground plane.

2. The shielding structure for a system-in-package of claim 1, wherein the shield layer is electrically coupled to the second ground plane.

3. The shielding structure for a system-in-package of claim 1, wherein the ground holes comprise a partial ground hole having an inner wall exposed on a side surface of the substrate, and wherein the shield layer is electrically coupled to the partial ground hole.

4. The shielding structure for a system-in-package of claim 1, wherein the first ground hole and the second ground hole are arranged in a staggered manner.

5. The shielding structure for a system-in-package of claim 1, wherein a vertical distance between a center of the first ground hole and a side surface of the substrate is different from a vertical distance between a center of the second ground hole and the side surface of the substrate.

6. The shielding structure for a system-in-package of claim 1, wherein the diameter of the first ground hole is greater than or equal to 100 micrometers ($\mu m$) and less than or equal to 300 $\mu m$, and wherein the diameter of the second ground hole is greater than or equal to 50 $\mu m$ and less than or equal to 150 $\mu m$.

7. The shielding structure for a system-in-package of claim 1, wherein the ground holes comprise a plurality of rows of ground holes arranged in an inclined manner relative to the edge of the substrate.

8. The shielding structure for a system-in-package of claim 1, further comprising a first stress relief region disposed on a side surface of the substrate.

9. The shielding structure for a system-in-package of claim 8, further comprising a second stress relief region disposed on a corner of the substrate.

10. The shielding structure for a system-in-package of claim 1, wherein a diameter of one or more of the ground holes is greater than or equal to 50 micrometers ($\mu m$) and less than or equal to 300 $\mu m$.

11. The shielding structure for a system-in-package of claim 1, wherein a spacing between adjacent ground holes at a same layer is less than 300 micrometers ($\mu m$).

12. A system-in-package apparatus comprising:
    a shielding structure, comprising:
        a substrate, wherein the substrate comprises a first surface and an opposing second surface;
        two stacked first ground planes disposed in the substrate, wherein each first ground plane is disposed around an edge of the substrate;
        a second ground plane disposed on the second surface, wherein the second ground plane surrounds an edge of the second surface, and wherein the second ground plane comprises a ring of ground pads arranged along the edge of the second surface; and
        a plurality of ground holes disposed in the substrate, wherein the ground holes are arranged along an edge of the substrate, wherein the ground holes comprise a first ground hole and a second ground hole, and wherein a diameter of the first ground hole is greater than a diameter of the second ground hole;
    a first electrical coupling between adjacent first ground planes and a second electrical coupling between the second ground plane and the first ground plane adjacent to the second ground plane, wherein the first and second electrical couplings comprise the ground holes;
    an electronic device disposed on the first surface of the substrate, wherein the electronic device comprises a package layer; and
    a shield layer, wherein the shield layer wraps the package layer and extends to the substrate, and wherein the shield layer extends to the substrate and is electrically coupled to the first ground plane.

13. The system-in-package apparatus of claim 12, wherein the shield layer is electrically coupled to the second ground plane.

14. The system-in-package apparatus of claim 12, wherein the ground holes comprise a partial ground hole having an inner wall exposed on a side surface of the substrate, and wherein the shield layer is electrically coupled to the partial ground hole.

15. The system-in-package apparatus of claim 12, wherein the first ground hole and the second ground hole are arranged in a staggered manner.

16. The system-in-package apparatus of claim 12, wherein a vertical distance between a center of the first ground hole and a side surface of the substrate is different from a vertical distance between a center of the second ground hole and the side surface of the substrate.

17. The system-in-package apparatus of claim 12, wherein the ground holes comprise a plurality of rows of ground holes arranged in an inclined manner relative to an edge of the substrate.

18. An electronic device disposed on a first surface of a substrate and comprising:
- a package layer;
- a shielding structure, comprising:
  - a substrate, wherein the substrate comprises the first surface and an opposing second surface;
  - two stacked first ground planes disposed in the substrate, wherein each first ground plane is disposed around an edge of the substrate;
  - a second ground plane disposed on the second surface, wherein the second ground plane surrounds an edge of the second surface, and wherein the second ground plane comprises a ring of ground pads arranged along the edge of the second surface;
  - a plurality of ground holes disposed in the substrate, wherein the ground holes are arranged along an edge of the substrate, wherein the ground holes comprise a first ground hole and a second ground hole, and wherein a diameter of the first ground hole is greater than a diameter of the second ground hole; and
  - a first electrical coupling between adjacent first ground planes and a second electrical coupling between the second ground plane and the first ground plane adjacent to the second ground plane, wherein the first and second electrical couplings comprise the ground holes; and
- a shield layer, wherein the shield layer wraps the package layer and extends to the substrate, and wherein the shield layer extends to the substrate and is electrically coupled to the first ground plane.

19. The electronic device of claim 18, wherein the first ground hole and the second ground hole are arranged in a staggered manner.

20. The electronic device of claim 18, wherein a vertical distance between a center of the first ground hole and a side surface of the substrate is different from a vertical distance between a center of the second ground hole and the side surface of the substrate.

* * * * *